United States Patent [19]

Swapp

[11] Patent Number: 5,063,311
[45] Date of Patent: Nov. 5, 1991

[54] PROGRAMMABLE TIME DELAY CIRCUIT FOR DIGITAL LOGIC CIRCUITS

[75] Inventor: Mavin C. Swapp, Mesa, Ariz.

[73] Assignee: Motorola, Inc., Schaumburg, Ill.

[21] Appl. No.: 533,231

[22] Filed: Jun. 4, 1990

[51] Int. Cl.$^5$ .................... H03K 5/159; G06G 7/12; H03G 3/10

[52] U.S. Cl. ................................ 307/603; 307/608; 307/597; 307/494; 328/55; 330/280

[58] Field of Search ............... 307/603, 608, 597, 455, 307/467, 494, 451; 328/55, 66; 330/254, 280, 310, 311

[56] References Cited

U.S. PATENT DOCUMENTS

| | | | |
|---|---|---|---|
| 4,152,667 | 5/1979 | Visser | 330/280 |
| 4,745,310 | 5/1988 | Swapp | 307/603 |
| 4,795,923 | 1/1989 | Dobos | 307/608 |
| 4,797,586 | 1/1989 | Traa | 307/608 |
| 4,839,609 | 6/1989 | Hara et al. | 330/311 |

Primary Examiner—Stanley D. Miller
Assistant Examiner—Trong Phan
Attorney, Agent, or Firm—Joe E. Barbee; Stuart T. Langley

[57] ABSTRACT

An ECL logic circuit having differential inputs and differential outputs and programmable propagation delay time is provided. The differential inputs are coupled to a first differential amplifier as is done on a conventional differential ECL circuit. A second feedback differential amplifier is coupled to the collectors of the first differential amplifier. Current in the first differential amplifier is normally constant, whereas current in the feedback differential amplifier can be programmably adjusted. By adjusting the current in the feedback differential amplifier the feedback differential amplifier loads the logic circuit forcing a voltage swing which is up to double that normally provided by the first differential amplifier, therefore increasing the time required for either output to change from a logic LOW to a logic HIGH. This delay results in a variable propagation delay which is controlled by adjusting current flow in the feedback differential amplifier.

10 Claims, 1 Drawing Sheet

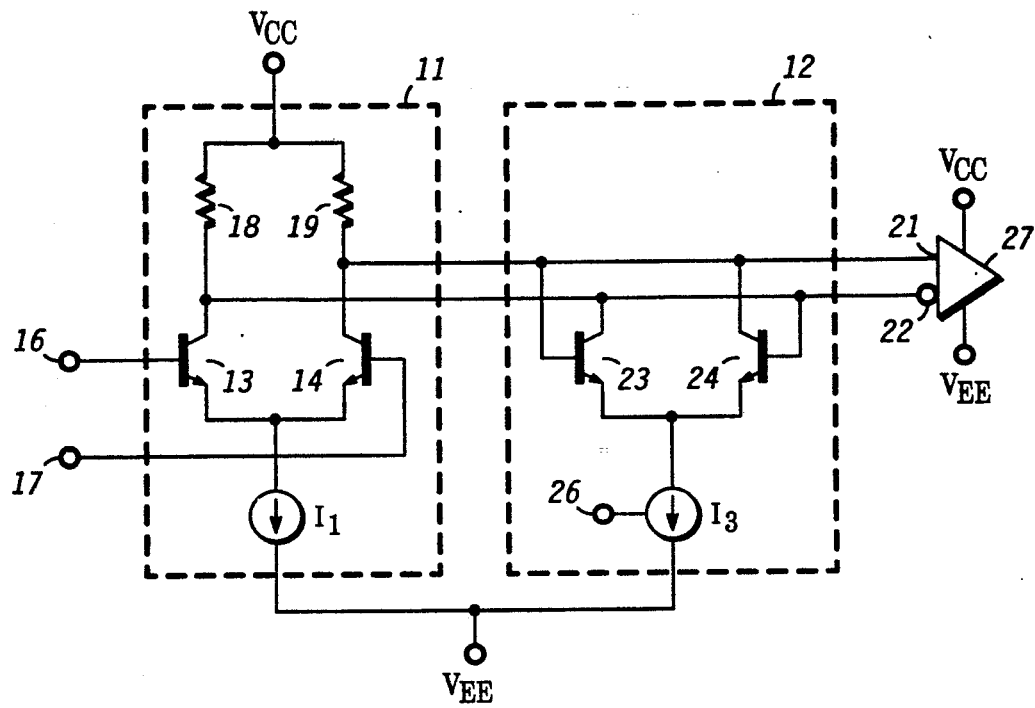
FIG. 1
FIG. 2
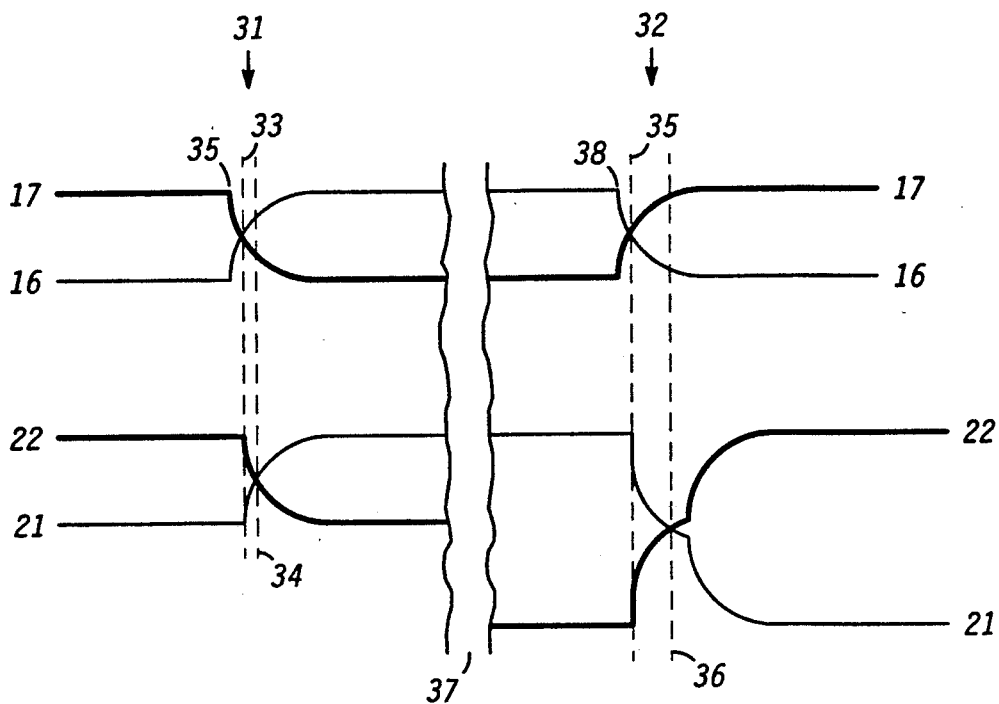

PROGRAMMABLE TIME DELAY CIRCUIT FOR DIGITAL LOGIC CIRCUITS

BACKGROUND OF THE INVENTION

The present invention relates, in general, to logic gates, and more particularly, to differential emitter coupled logic (ECL) gates used in programmable time delay circuits.

Differential ECL gates are used in numerous applications where high speed logic is required. A differential ECL circuit comprises a differential receiver having one inverting and one non-inverting input, and a pair of outputs coupled to the differential receiver. A typical differential receiver comprises a pair of differentially coupled transistors having emitters which are tied together. A base of one transistor is coupled to the non-inverting input of the differential circuit, while the base of the other transistor is coupled to the inverting input. Collectors of the differentially coupled transistors are coupled through resistors to a power supply voltage $V_{cc}$. Emitters of the differential receiver transistors are coupled through a current source to a second power supply $V_{EE}$ which is at a lower potential than $V_{CC}$. The differential outputs are coupled to the collectors of the differentially coupled transistors so that an input received at the base of one of the differentially coupled transistors results in an inverted output on one of the differential outputs.

Each leg of the differential receiver comprises one of the differentially coupled transistors together with its collector resistor. Current flow through each leg is a function of a voltage difference between the two differential inputs. One feature of the differential receiver is that current flow is rapidly switched from one leg to the other when voltage on the differential inputs is reversed. Usually this current switching occurs almost entirely within a few tens of millivolts in differential voltage.

A result of this switching characteristic is that when a logic state change occurs at the differential inputs, the differential outputs will remain steady until the differential input voltage passes through a zero point. This point is also referred to as a switching point of the circuit. As the differential input voltage approaches zero, the differential output voltage begins to change. A time lag results between the instant the outputs begin to change in response to a change in inputs, and a time when the input transistors of a sequentially coupled ECL circuit begin to respond. This time lag is called a propagation delay time ($t_{pd}$) for the circuit.

Although ECL logic gates with differential inputs have a very low propagation delay in the range of a few hundred picoseconds, until now this propagation delay has been fixed and not controllable by the user of the logic circuit. Oftentimes it is desirable that the propagation delay be programmable via an external signal to the logic circuit. Until now this need could only be met by coupling two or more logic circuits in series to provide multiple gate delays. This solution increases size, and therefore cost of the logic circuit.

Accordingly, it is an object of the present invention to provide an ECL logic circuit having a variable propagation delay.

It is another object of the present invention to provide an ECL logic circuit having differential inputs and differential outputs wherein the response of each of the differential outputs can be controllably delayed.

A further object of the present invention is to provide a differential input ECL logic circuit having a feedback differential receiver which can controllably change an output voltage swing of the circuit to increase propagation delay.

SUMMARY OF THE INVENTION

These and other objects and advantages of the present invention are achieved by providing an ECL logic circuit having differential inputs and differential outputs. The differential inputs are coupled to a first differential amplifier as is done on a conventional differential ECL circuit. A feedback differential amplifier is coupled to the collectors of the first differential amplifier. Current in the first differential amplifier is normally constant, whereas current in the feedback differential amplifier can be programmably adjusted. By adjusting the current in the feedback differential amplifier the feedback differential amplifier increases current in collector resistors forcing a voltage swing which is up to double that normally provided by the first differential amplifier, therefore increasing the time required for either output to change from a logic LOW to a logic HIGH. This delay results in a variable propagation delay which is controlled by adjusting current flow in the feedback differential amplifier.

BRIEF DESCRIPTION OF THE DRAWINGS

FIG. 1 illustrates a schematic diagram of a logic circuit in accordance with the present invention; and FIG. 2 illustrates a timing diagram of the logic circuit shown in FIG. 1.

DETAILED DESCRIPTION OF THE DRAWINGS

FIG. 1 illustrates a schematic diagram of an ECL logic circuit having a variable propagation delay. The ECL logic circuit comprises receiver portion 11, which is a conventional circuit for a differential ECL receiver. The ECL circuit also includes a feedback differential receiver 12 which serves to vary a voltage swing of the ECL circuit and vary propagation delay through the circuit. Differential outputs 21 and 22 are usually coupled to another differential ECL receiver 27 which, for the purposes of discussion, has input characteristics similar to those which will be described for differential receiver 11.

Differential receiver 11 comprises first and second transistors 13 and 14 having emitters coupled together to form a differential amplifier. The base of transistor 13 is coupled to non-inverting input 16 and the base of transistor 14 is coupled to inverting input 17. Although the terms "inverting" and "non-inverting" are chosen to distinguish between each of the differential inputs and outputs, it should be understood that reversing the non-inverting and inverting signals at inputs 16 and 17 will correspondingly reverse the non-inverting and inverting output signals at outputs 21 and 22, but will not otherwise affect the internal operation of differential receiver 11. The collector of transistor 13 is coupled to a first power supply $V_{cc}$ through resistor 18. The collector of transistor 14 is coupled to the $V_{cc}$ power supply through resistor 19. The emitters of transistors 13 and 14 are coupled together and coupled through current source $I_1$ to a second power supply $V_{EE}$. Commonly $V_{CC}$ is held at ground potential, while $V_{EE}$ is at a negative potential.

The differential input receiver of the ECL circuit is designed to operate with input 16 being logically opposite that of input 17. Also, as a state change occurs on either input 16 or 17, an equal and opposite state change normally occurs on the other input. Non-inverting output 21 is coupled to the collector of transistor 14, while inverting output 22 is coupled to the collector of transistor 13. Ordinarily, outputs 21 and 22 are coupled to an output buffer stage (not shown) such as an emitter follower to improve performance of the ECL circuit. The output stage, although commonly used, is not necessary for the understanding of the present invention.

In operation, the ECL logic circuit is designed to operate with a predetermined output voltage swing across resistors 18 and 19 which corresponds to the difference between a logic high and a logic low level. Commonly, this logic swing for an ECL circuit is approximately 0.8 volts, but may be as low as 200 mv or less for ECL circuits which are embedded within larger ECL devices. Current source $I_1$ is designed to provide this output logic swing across resistors 18 and 19 when either transistors 13 or 14 are in a conducting state.

Feedback differential receiver 12 comprises a differential amplifier including transistors 23 and 24. The base of transistor 23 is coupled to the collector of transistor 14, which is also output 21. The base of transistor 24 is coupled to the collector of transistor 13, which is also output 22. If emitter followers are used on outputs 21 and 22, improved performance is achieved by coupling the bases of transistors 23 and 24 to the emitters of the emitter followers. The emitters of transistors 23 and 24 are coupled together and coupled through programmable current source $I_3$ to second power supply voltage $V_{EE}$.

Programmable current source $I_3$ is controlled by control terminal 26. A variety of circuit designs are well known to provide programmable or controllable current source $I_3$. A signal on control terminal 26 controls current flow in current source $I_3$. Current source $I_3$ is preferably designed to carry the same current as current source $I_1$ when fully activated. So long as current flows through current source $I_3$, feedback differential receiver 12 operates in a similar fashion to differential receiver 11 and draws up to an equal amount of current through resistors 18 and 19. It should be apparent that when feedback differential receiver 12 is in operation the voltage drop across resistors 18 or 19 will be up to twice that which would occur when feedback differential receiver is not operational. The amount of current which flows through transistors 23 and 24 is regulated by the signal on control terminal 26.

FIG. 2 illustrates timing diagrams of the ECL logic circuit shown in FIG. 1. Each of the waveforms 16, 17, 21, and 22 shown in FIG. 2 corresponds to an input or output terminal with the same designation in FIG. 1. Non-inverting input 16 and inverting output 22 are illustrated in bold to aide understanding of FIG. 2. The first region of interest, indicated generally at 31, illustrates function of the ECL circuit when current flow in current source $I_3$ is zero. In this case, the ECL circuit functions as a normal ECL circuit would if feedback differential receiver 12 were not present.

Inverting input 17 begins to go negative and non-inverting input 16 begins to go positive at 35. As switching continues, a switching point is reached, illustrated by dash line 33, at which transistors 13 and 14, shown in FIG. 1, begin to switch current. For all practical purposes the switching point 33 occurs where inputs 16 and 17 cross, or have zero differential voltage. At switching point 33 outputs 22 and 21 become responsive to the change in input and begin to change logic state. Switching point 33 occurs at about half of the logic swing, or when a 0.4 logic swing is used, switching point 33 occurs when both outputs have changed by 0.2 volts. Like the inputs, outputs 21 and 22 provide a switching point 34 at which the output voltages have changed enough so that the logic state change could be detected by subsequent logic circuit 27 coupled to outputs 21 and 22. The time difference between switching point 34 and 33 is known as a propagation delay time ($t_{pd}$) for the circuit.

A portion of the waveform shown generally at 32 illustrates function of the ECL circuit, shown in FIG. 1, when control input 26 is set so that current flows through $I_3$. Preferably, current flow in $I_3$ is controllable in the range $0 \leq I_3 \leq I_1$. In region 32 of FIG. 2 before switching point 35, switching transistor 23 is operative and carries a current equal to that of current source $I_3$. After switching has occured transistor 24 carries current $I_3$. As a result of this, extra current is drawn through resistor 18 and the voltage swing across resistor 18 is double that of when $I_3 = 0$ and transistors 23 and 24 are inoperative. At a time period shown generally at 37 in FIG. 2, output 22, which is at a logic low, falls to even lower potential as a result of programmable current source $I_3$. It should be noted that the logic high level remains constant, while the logic low level falls to a lower voltage as a result of the additional current flowing through resistor 18.

Inverting input 17 begins to go positive and non-inverting input 16 begins to go negative at 38. As switching point 35 is reached on inputs 16 and 17, outputs 21 and 22 begin to shift logic states as described earlier. However, unlike the switching situation described earlier, switching point 36 is not reached until much later because of the larger voltage swing which output 22 must go through. Output waveform 22 has two distinct regions of logarithmic increase while switching. This is because output 22 begins to switch in a normal fashion, but feedback differential amplifier 12, shown in FIG. 1, cannot switch until output switching point 36 is reached. Switching point 36 does not occur until switching of differential amplifier 11 is almost 80% complete. By comparison, when feedback differential amplifier 12 is inactive, switching point 34 occurs when switching of differential amplifier 11 is only 50% complete.

The propagation delay between switching point 36 and switching point 35 is approximately two and a half times the propagation delay of switching points 34-33. The length of this delay is a function of the current flowing through $I_3$, shown in FIG. 1, and therefore regulated by control input 26. The actual value of the propagation delay can be varied in very small increments by changing the input on terminal 26.

Although the preferred embodiment has been described in terms of a purely ECL logic circuit, with minor modifications it will be apparent that the variable propagation delay circuit of the present invention can be used with other types of logic family, such as TTL, or combined with MOS logic. Likewise, although the circuit is particularly applicable to time delay circuits, the variable propagation delay circuit of the present invention is useful in active temperature compensation of propagation delay or in precision matching of propagation delay between devices.

By now it should be apparent that an ECL logic circuit having a variable propagation delay has been provided. The variable propagation delay is provided by coupling a feedback differential receiver to the outputs of a conventional ECL logic circuit so that the feedback differential receiver changes voltage levels of the ECL logic circuit, increasing propagation delay. The feedback differential receiver is controlled by an external control input and can provide a large degree of output voltage swing for the circuit, limited only by the power supplies available, and conveniently doubles the voltage swing of the unloaded ECL circuit, thereby providing a two-fold increase in propagation delay through the circuit.

I claim:

1. A logic circuit having first and second differential inputs and first and second differential outputs which are responsive to the inputs comprising: a means for delaying a response at one of the outputs when a change occurs at the differential inputs, wherein the means for delaying is controlled by an external signal and is coupled to each of the differential outputs, wherein the means for delaying a response further comprises
   a first transistor having a collector, base, and emitter, wherein the collector of the first transistor is coupled to the first differential output and the base of the first transistor is coupled to the second differential output; and
   a second transistor having a collector, base, and emitter, wherein the collector of the second transistor is coupled to the second differential output and the base of the second transistor is coupled to the first differential output, and the emitter of the second transistor is coupled to the emitter of the first transistor.

2. The logic circuit of claim 1 further comprising a controllable current source coupled between the emitters of the first and second transistors and a second power supply voltage.

3. A logic circuit having a differential input and a differential output, the circuit comprising: a first differential amplifier having inputs, an inverting output, a non-inverting output; a fixed current source coupling the first amplifier to a power supply, wherein the inputs to the first differential amplifier provide the differential input for the logic circuit; and a second differential amplifier having a first input, a second input, a first output, and; a programmable current source, for coupling the second amplifier to the power supply, wherein the first input of the second differential amplifier is coupled to the inverting output of the first differential amplifier, the second input of the second differential amplifier is coupled to the non-inverting output of the first differential amplifier, the first output of the second differential amplifier is coupled to the non-inverting output of the first differential amplifier, and the second output of the second differential amplifier is coupled to the inverting output of the first differential amplifier.

4. The logic circuit of claim 3 wherein the second differential amplifier further comprises a first transistor having a collector coupled to the non-inverting output of the first differential amplifier and a base coupled to the inverting output of the first differential amplifier; a second transistor having a collector coupled to the inverting output of the first differential amplifier and a base coupled to the non-inverting output of the first differential amplifier, wherein emitters of the first and second transistors are coupled together to comprise the second differential amplifier.

5. A method of programmably altering propagation delay in a logic circuit comprising: providing a pair of inputs; providing first and second output nodes; differentially amplifying an input signal on the pair of inputs to produce a first differential output signal on the first output node and a second differential output on the second output node; selectively coupling a programmable load to the first output node when the output signal is present on the second output node; selectively coupling the programmable load to the second output node when the output signal is present on the first output node; programmably loading one output signal of the differential outputs to provide a predetermined, variable signal amplitude on the output, wherein the logic circuit has a first propagation delay at one signal amplitude and second propagation delay at another signal amplitude.

6. A programmable time delay circuit for digital logic circuits comprising: a non-inverting input; a first switch responsive to the non-inverting input; an inverting input; a second switch responsive to the inverting input; a first means for generating a output signal coupled in series with the first switch; a second means for generating an output signal coupled in series with the second switch; a third means for determining magnitude of the output signal coupled in series with the first and second switches, wherein the third means for determining magnitude is non-programmable; and a fourth means for determining magnitude of the output signal coupled to the first and second means of generating an output signal, wherein the fourth means for determining magnitude is controlled by an external signal and propagation delay of the time delay circuit is proportional to magnitude of the output signal.

7. The delay circuit of claim 6 wherein the first and second switch comprise NPN bipolar transistors.

8. The delay circuit of claim 6 wherein the first means for generating an output signal comprises a first resistance coupled in series with the first switch and the second means for generating an output signal comprises a second resistance coupled in series with the second switch, and the output signal is generated by voltage drop across the first and second resistances.

9. The delay circuit of clam 7 wherein the third means for determining magnitude of the output signal further comprises a fixed current source coupled in series with the first and second switches.

10. The delay circuit of claim 6 wherein the fourth means for determining magnitude of the output signal further comprises: a programmable current source controlled by the external signal; a third switch responsive to the first output signal coupled in series with the second means for generating an output signal; and a fourth switch responsive to the second output signal coupled in series with the first means for generating an output signal.

* * * * *